United States Patent [19]

Maloney

[11] Patent Number: 4,821,096
[45] Date of Patent: Apr. 11, 1989

[54] EXCESS ENERGY PROTECTION DEVICE

[75] Inventor: Timothy J. Maloney, Palo Alto, Calif.

[73] Assignee: Intel Corporation, Santa Clara, Calif.

[21] Appl. No.: 813,174

[22] Filed: Dec. 23, 1985

[51] Int. Cl.[4] .................. H01L 29/78; H01L 27/02
[52] U.S. Cl. .................. 357/23.13; 357/23.14; 357/41
[58] Field of Search .............. 357/23.13, 23.1, 41, 357/71, 23.14, 42, 35; 307/304

[56] References Cited

U.S. PATENT DOCUMENTS

| 3,409,523 | 11/1968 | Garbarini | 357/71 |
|---|---|---|---|
| 3,538,449 | 11/1970 | Solomon | 357/35 |
| 3,628,070 | 12/1971 | Heuner et al. | 307/304 |
| 3,852,623 | 12/1974 | Nelson et al. | 307/304 |
| 3,889,211 | 6/1975 | Morozumi | 307/304 |
| 4,011,467 | 3/1977 | Shimada et al. | 307/304 |
| 4,044,373 | 8/1977 | Nomiya et al. | 357/23 |
| 4,066,918 | 1/1978 | Heuner et al. | 357/23.13 |
| 4,616,243 | 10/1986 | Minato et al. | 357/23.13 |
| 4,633,283 | 12/1986 | Avery | 357/35 |
| 4,684,877 | 8/1987 | Shreve et al. | 357/35 |
| 4,686,387 | 8/1987 | Rumelhard | 307/304 |
| 4,739,437 | 4/1988 | Morgan | 357/23.13 |

Primary Examiner—Martin H. Edlow
Assistant Examiner—Gregory Key
Attorney, Agent, or Firm—Blakely, Sokoloff, Taylor & Zafman

[57] ABSTRACT

A device for protecting semiconductor devices during excess energy events. The device uses p-MOS field effect transistors in a common n-well with a common gate configuration. An input is coupled to the source of a first p-type transistor and to the n-well. The first transistor is coupled through a series resistor to a second p-MOS transistor. The drains of each transistor are coupled to ground and gate aided breakdown reduces the voltage at which breakdown occurs.

18 Claims, 3 Drawing Sheets

EXCESS ENERGY PROTECTION DEVICE

BACKGROUND OF THE INVENTION

1. Field of the Invention

This invention relates to the field of excess energy protection schemes for semiconductor devices.

2. Background Art

Semiconductor devices, whether utilized as part of an integrated circuit or as a discrete component, are often subject to excess energy events. An excess energy event is a surge of power, often caused by a voltage or current spike, which can damage the semiconductor device itself, or lead to degradation or failure of metal contacts associated with the device. When a device is subjected to an excess energy event, the device dissipates the power as heat. Power is proportional to the square of the voltage and the voltage at which power is dissipated is dependent on the breakdown voltage of the affected device. By coupling to the protected device devices which have lower breakdown voltages, the power dissipated will be decreased, reducing the effect of heat in device failure. Additionally, by dissipating the excess energy through a protecting device, the active device is not exposed to voltage levels which can cause failure.

Certain types of excess energy events can adversely affect integrated circuits. A packaged integrated circuit can often build up large static charges as a result of handling, transportation, etc. The discharge of this static buildup in the integrated circuit is known as an electrostatic discharge (ESD) event. The voltages involved in such ESD events are very large, ranging as high as 250K volts. In addition, integrated circuits are subjected to other energy events from other sources, for example, voltage and current surges. These events create excess electrical energy which is dissipated within the circuit. Generally, the discharge path of this energy is from an input/output pad to ground and can involve the initial stages of the integrated circuit If the excess energy event exceeds the oxide breakdown voltage of a device in the initial stage, oxide breakdown and failure may result. Additionally, metal/silicon contacts and Pn junctions may be thermally damaged as a result of the heat dissipated from the excess energy event.

In order to limit the impact of excess energy events, protection devices are inserted between the pad and the initial stage of the integrated circuit One prior art protection device consists of a pair of diodes coupled to the input. One diode is coupled to a high power supply voltage level and the other is coupled to a low power supply voltage level or ground. A disadvantage of such a protection device is the inability to implement signature modes due to the high voltage reference coupled to the first transistor.

A second prior art protection device consists of a grounded gate n-channel transistor which may be coupled through a resistor to a pad. Although this method allows signature modes to be implemented, the device is not always effective in CMOS applications The studies have shown that the resistor fails or that n-channel devices fail during high energy events because of alloy spiking of the n+ junction In n-MOS processing, this defect can be overcome by utilizing deep n+ junctions. However, in CMOS processing shallow n+ junctions are often employed. As a result, the alloy spiking causes failure of n-channel protection devices. This defect can be overcome by enlarging the contact to gate spacing, but this requires additional silicon area which adds to the size of the integrated circuit.

Therefore, it is an object of the present invention to provide excess energy protection for semiconductor devices.

It is another the object of the present invention to provide excess energy protection which requires a minimum of silicon area.

It is a still further object of the present invention to provide excess energy protection without the use of deep n+ plugs.

It is yet another object of the present invention to provide excess energy protection which can be utilized with CMOS technology.

SUMMARY OF THE PRESENT INVENTION

The present invention utilizes a pair of p-channel transistors and a series resistor to provide excess energy protection for a semiconductor device A pair of p-channel transistors with their drains coupled to ground shunt excess energy current and voltage. A series resistor coupled between the transistors provides additional energy dissipation and protection. The p-channel transistors are formed in a dedicated n-well with a device input coupled to the n-well. As a result, no VCC reference is required, allowing the device voltage to be raised above VCC. Thus, signature modes may be implemented in the device. The two p-MOS transistors utilize a common gate along with a common well to allow for more compact fabrication and to provide for a lower breakdown voltage in the second transistor, providing additional excess energy protection.

DETAILED DESCRIPTION OF THE PRESENT INVENTION

A device which provides protection against excess energy events is described. In the following description, numerous specific details are set forth, such as breakdown voltage, conductivity type, etc. in order to provide a more thorough understanding of the present invention. It will be obvious, however, to one skilled in the art that the present invention ay be practiced without these specific details. In other instances, well known circuits have not been described in detail in order not to unnecessarily obscure the present invention.

Figure 1A:
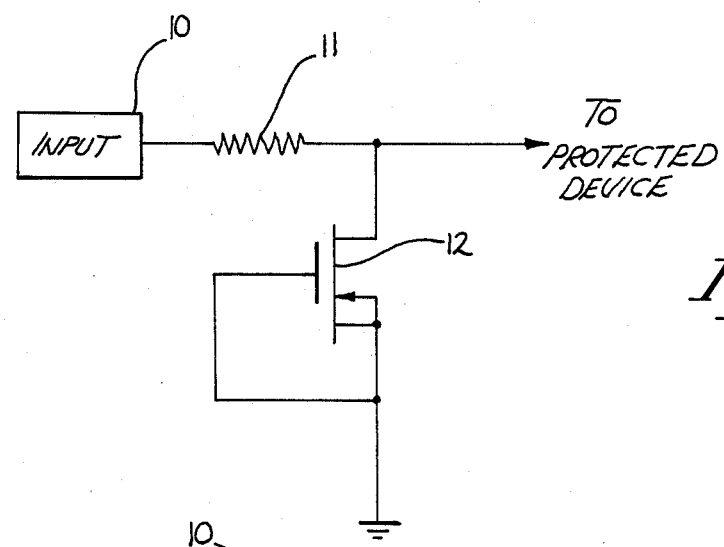
FIGS. 1a and 1b illustrate prior art protection devices.
Figure 1B:
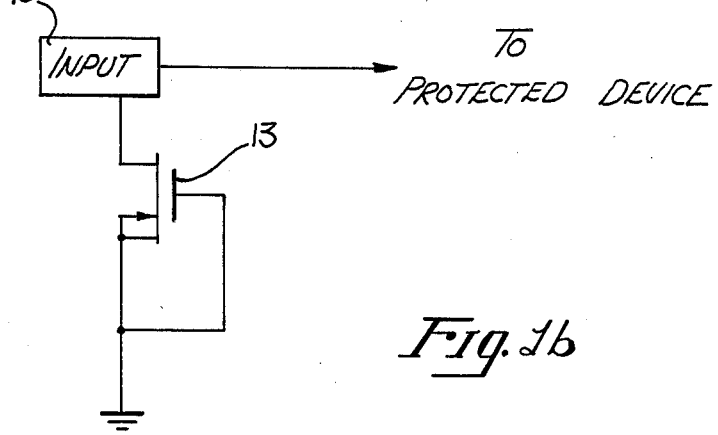

Prior art schemes for providing excess energy protection for semiconductor devices are shown in FIGS. 1a and 1b. A grounded gate n-MOS transistor behind a diffused series resistor is shown in FIG. 1a while FIG. 1b shows a large grounded gate n-MOS transistor used alone. In FIG. 1a, a series resistor 11 is formed between the input 10 and the protected device stage. An n-MOS transistor 12 is shunted from the resistor 11 to ground. The source and gate of the n-MOS transistor 12 are both coupled to ground. In FIG. 1b, n-MOS transistor 13 is coupled directly to the input 10. As with transistor 12, the gate and source of transistor 13 are coupled to ground. A stage resembling FIG. 1a is often added to the scheme shown in FIG. 1b. In both cases, the transistor turns on during an excess energy event and goes into snapback mode. This clamps the voltage to a low value and provides protection to the integrated circuit. However, prior art methods have a disadvantage of nonuniform lateral current distribution which concentrates snapback current in a few junction locations, overheating contacts and leading to failure. By utilizing deep n+ plugs this localized current concentration can be tolerated. But in CMOS technology, where deep n+ plugs cannot always be used, these prior art methods are not always available to provide excess energy protection.

Figure 2:
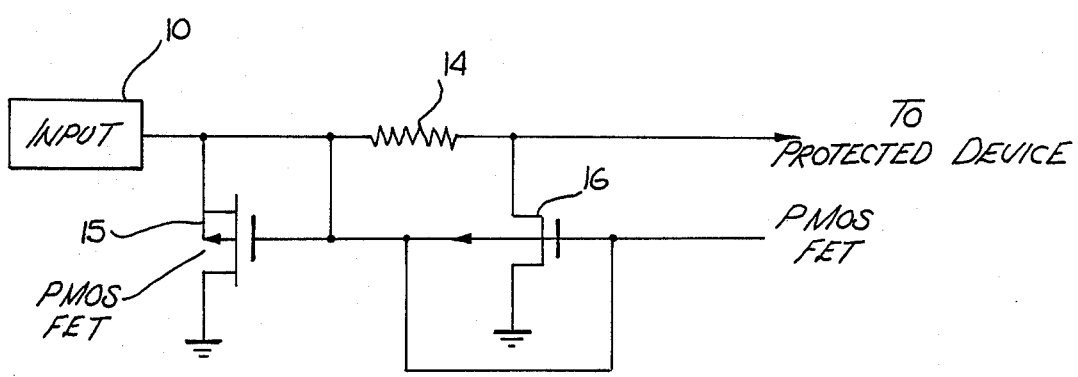
FIG. 2 is an electrical schematic illustrating the protection device of the present invention.

The preferred embodiment of the present invention is illustrated in FIG. 2. A pair of p-MOS field effect transistors 15 and 16 having a common gate are formed across a series resistor 14. The drains of these transistors 15 and 16 are coupled to ground. The source for transistor 15 is coupled to the input 10 while the source of transistor 16 is coupled through resistor 14 to the input 10. The input 10 is coupled to an n-well dedicated to these devices The construction is such that negative voltage surges will be clamped to ground by a large forward biased diode while positive voltage surges will send the p-MOS devices into reverse breakdown. There is no VCC reference, so that signature modes may be implemented.

Figure 3:
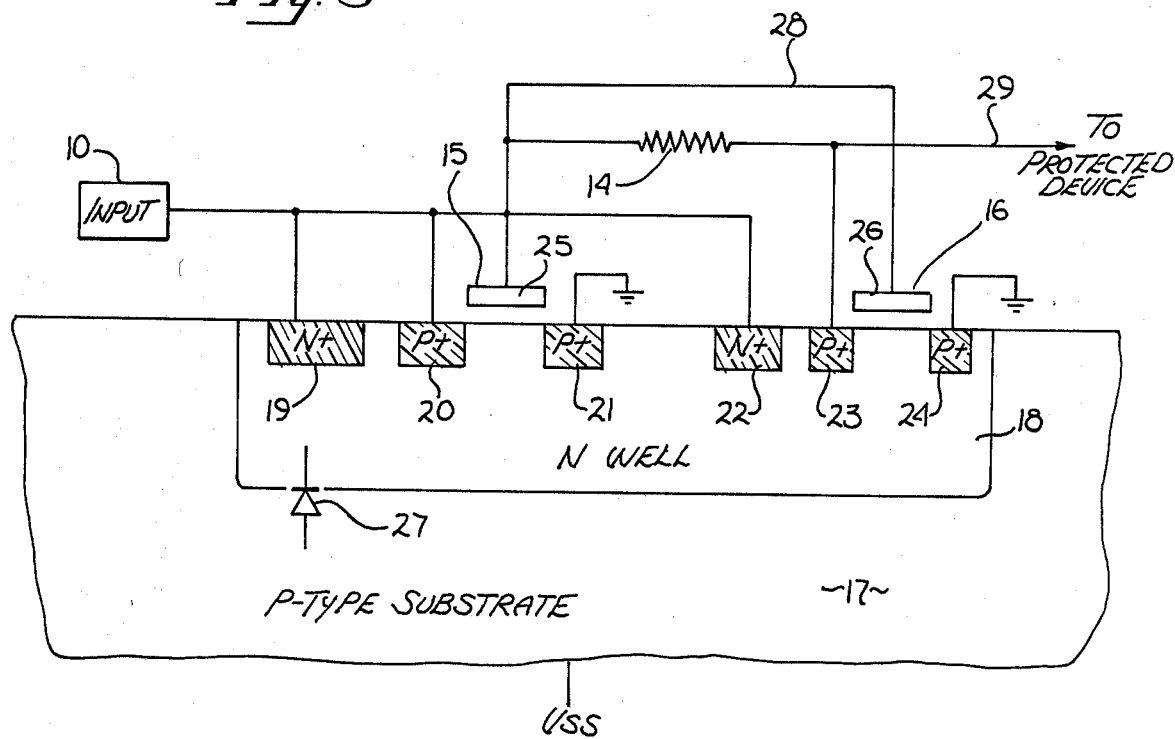
FIG. 3 is a cross-sectional view of the preferred embodiment of the present invention.

The layout of the device is shown in FIG. 3. In the preferred embodiment the device is formed on a p-type substrate 17. Initially, an n-well 18 is formed in the substrate layer 17. The n-well 18 may be diffused, implanted, or grown epitaxially. In the preferred embodiment, the n-well 18 is diffused. Next, n+ and p+ regions are formed in the n-well. The n-plus regions 19 and 22 are used to provide an n-well contact to the input 10. The p+ regions 20 and 21 form the source and drain of the p-MOS transistor 15 of FIG. 2. The p+ regions 23 and 24 form the source and drain of p-MOS transistor 16 of FIG. 2. Gates 25 and 26 are then formed for transistors 15 and 16 respectively. A diode 27 is formed at the junction between p-type substrate 17 and the n-well 18.

The input 10 is coupled to the source 20 of transistor 15. The drain 21 of transistor 15 is grounded. The input 10 is also coupled to n+ regions 19 and 22, providing an n-well connection. Transistors 15 and 16 have their gates 25 and 26 coupled together through line 28 Gate 25 is coupled through resistor 14 to source 23 of transistor 16 and to the protected device on line 29.

During negative voltage surges, dice 27 becomes forward biased. The substrate 17 is grounded an the n-well 18 is at a large negative voltage, (being coupled o input 10 through well tap 19). The resulting energy dissipation occurs along the n-well 18/substrate 17 interface, away from sensitive devices and heat sensitive contact points.

The protection device of the preset invention functions as a two stage network for positive voltage surges. A positive voltage on input 10 will put transistor 15 in the breakdown mode. In the reverse breakdown mode, there is fairly high internal resistance in a p-MOS device Therefore to prevent high voltage pulses on the thin gate oxide of the protected transistors, the voltage through transistor 16 is limited by the resistor 14. The reverse breakdown voltage of transistor 5 is approximately 10 to 20 volts, limiting pad voltage to 50 to 0 volts for typical excess energy events. By utilizing a common n-well, the source-drain breakdown for the second transistor, transistor 16, is lower than it would be if a separate n-will were used. In p-MOS transistors, breakdown is triggered in part by a large electric field between the gate and the drain. The drain 24 of transistor 16 is grounded and the gate voltage helps trigger breakdown at a lower voltage, typically 10 volts.

In addition to allowing compact lay-out and implementation of signature modes, the present invention draws no current under normal operating conditions. Additional, the device is particularly insensitive to process variations. N-MOS structures in reverse breakdown have been found to conduct avalanche current nonuniformly across the device periphery, which can cause localized destruction of the device at low energies. However, p-MOS devices show uniform avalanche current conduction during reverse breakdown, preventing point failure and resulting in correspondingly higher destruction energy. Oxide trapping, which can be affected by process variations, i.e. believed to be one cause of localized current lock-on for those devices. However, oxide trapping does not effect a p-MOS device's operation, so that those process variations will not effect the performance of the p-MOS device.

Both p-MOS and n-MOS protection devices are sensitive to the breakdown and failure of metal-silicon contacts. Studies have shown that the low barrier height o Al on p-type silicon (p-Si) (0.38 eV) jeopardizes the Al-Si contact to p-Si due to thermionic emission; a contact with higher barrier height for p-Si (such as titanium, 0.61 eV) has been sown to be much more immune to contact spiking. All the p-channel devices discussed herein will have a reduced likelihood of metal-silicon failure with a titanium barrier in the ohmic contact. Moreover, some increase of the contact to gate (or contact to diffusion edge) spacing over minimum dimensions will also help to protect the contacts during excess energy events.

Figure 5:
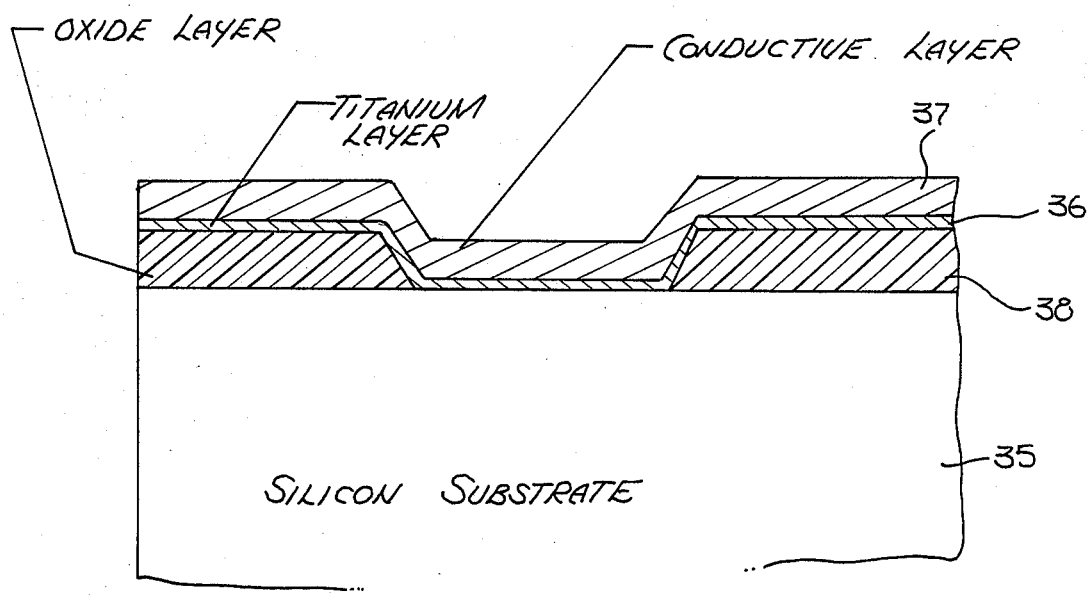
FIG. 5 is a cross-sectional view illustrating a contact of the present invention.

FIG. 5 illustrates a cross-sectional view of a contact utilizing a titanium barrier. Typically, a contact to a transistor (such as to a source or drain) is accomplished by forming a layer of aluminum on the surface of the silicon. In one embodiment of the present invention, the contacts are formed by etching the passivation 38 and then employing a layer 36 of titanium on the surface of the silicon 35 at the region at which contact is desired. An aluminum layer 37 is formed on the titanium layer 36. As noted, the titanium layer provides increased immunity to contact spiking and a corresponding decrease in the likelihood of contact breakdown. Although the present invention utilizes titanium as a barrier, it will be obvious that other materials which raise the barrier height at the area of contact will have similar beneficial effects. For example, tungsten may be utilized. Additionally, although aluminum has been described as the contact metal, any suitable conductive layer may be employed.

Figure 4:
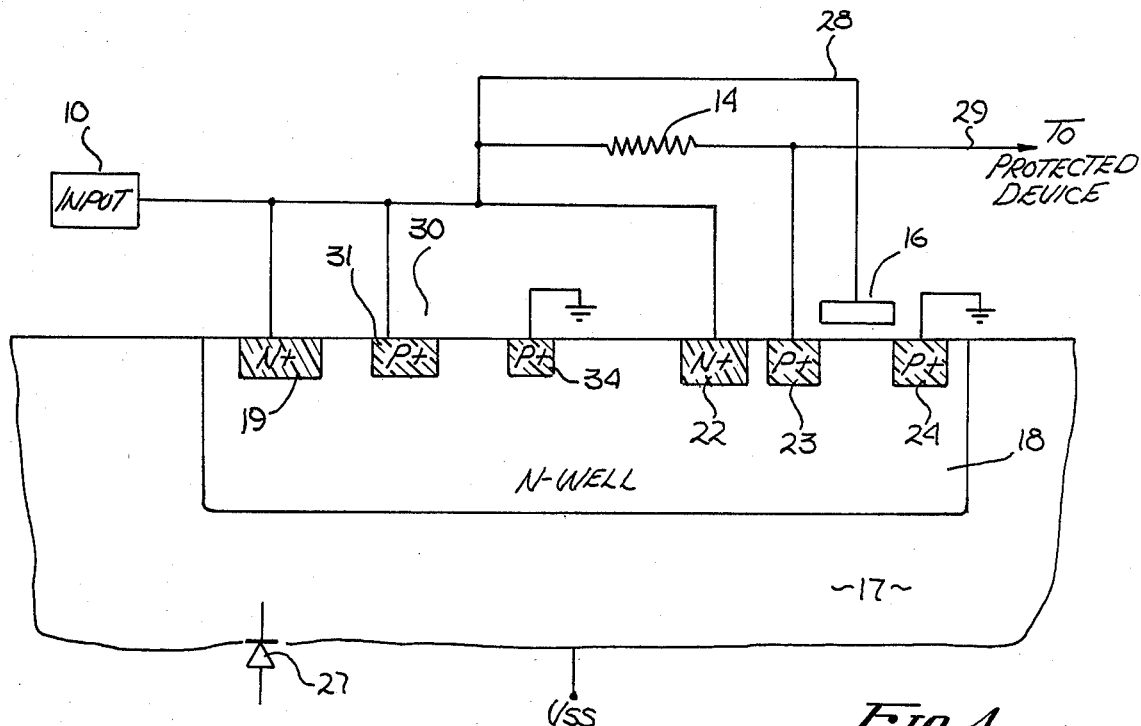
FIG. 4 is a cross-sectional view of an alternate embodiment of the present invention.

FIG. 4 illustrates an alternate embodiment of the present invention in which p-MOS transistor 15 is replaced with a p+-n-p+ transistor 30. A p+ emitter region 3]is coupled to the input 10. N-well 18 acts as a base region and is also coupled to input 10. Contact to n-well 18 is through n+ region 19. A p+ collector region 34 is coupled to ground. A negative voltage pulse on input 10 will again be dissipated by diode 27. A positive voltage pulse will send the collector/base junction of transistor 30 into reverse breakdown. Transistor 3C does not have the gate-aided breakdown feature of a p-mos transistor. In order to retain that feature in this alternate embodiment, p-mos transistor 16 is again used as a second transistor. However, a pnp lateral transistor may be utilized as the second transistor.

Another alternate embodiment of the present invention utilizes separate n-wells for the two protecting transistors. However, such a configuration requires additional silicon area and requires a guard ring to separate the wells.

Finally, the second transistor can ba an n-mos transistor with its own guard rings. This configuration may also require more silicon area than the preferred embodiment.

Thus, an excess energy protection device wit compact layout and process insensitivity has been described. The protection device exploits gate aided breakdown for clamping of the excess energy event at a low voltage.

I claim:

1. A protection device for protecting a semiconductor device from an excess event comprising:
   a first pnp lateral transistor having a collector and an emitter region of a first conductivity type, said emitter region being coupled to an input of said device, said transistor having a base region of a second conductivity type coupled to said input of said device, said collector region being coupled to ground;
   at least a second pnp lateral transistor having an emitter and a collector region of said first conductivity type, said emitter region being coupled through a resistor to said input, said transistor having a base region of second conductivity type, said collector region being coupled to ground;
   whereby said transistors dissipate power during an excess energy event.

2. The protection device as described by claim 1 wherein said first transistor is formed in a well of a second conductivity type, said well coupled to said input.

3. The protection device as described by claim 2 wherein said second transistor is formed in said well.

4. The protection device as described by claim 2 wherein said second transistor is formed in a second well of a second conductivity type.

5. The protection device as described by claim 1 wherein said first and second transistors are formed on a silicon substrate, contacts to said emitter and collector regions of said transistors comprising a first conductive layer for raising the barrier height at said contacts.

6. The protection device as described by claim 5 wherein said first conductive layer comprises titanium.

7. The protection device as described by claim 5 wherein said first conductive layer comprises tungsten.

8. The protection device as described by claim 5 wherein a second conductive layer comprises aluminum.

9. A protection device for protecting a semiconductor device from an excess energy event comprising:
   a first transistor having a first region of a first conductivity type coupled to an input of said device, said first transistor having a second region of said first conductivity type coupled to ground;
   at least a second transistor having a third region of said first conductivity type coupled through a resistor to said input, said second transistor having a fourth region of said first conductivity type coupled to ground;
   said first transistor having a common gate with said second transistor;
   whereby said transistors dissipate power during an excess energy event.

10. The circuit of claim 9 wherein said first and second transistors comprise p-channel transistors.

11. The circuit of claim 9 wherein said first and second transistors are formed in a common well.

12. The circuit of claim 9 wherein said first and second transistors comprise pnp lateral transistors.

13. The circuit of claim 10 wherein said first region comprises a source region and said second comprises a drain region.

14. The circuit of claim 10 wherein said third region comprises a source region and said fourth region comprises a drain region.

15. The circuit of claim 12 wherein said first region comprises an emitter region and said second region comprises a collector region.

16. The circuit of claim 12 wherein said third region comprises an emitter region and said fourth region comprises a collector region.

17. The circuit of claim 9 wherein said first transistor is formed in a well of a second conductivity type, said well being coupled to said input.

18. The circuit of claim 17 wherein said second transistor is formed in said well.

* * * * *

UNITED STATES PATENT AND TRADEMARK OFFICE
CERTIFICATE OF CORRECTION

PATENT NO. : 4,821,096

DATED : 4/11/89

INVENTOR(S) : Maloney

Page 1 of 2

It is certified that error in the above-identified patent and that said Letters Patent is hereby corrected as shown below:

| | | |
|---|---|---|
| col. 01, line 40 | after "circuit" | insert --.-- |
| col. 01, line 48 | after "circuit" | insert --.-- |
| col. 01, line 60 | after "applications" | insert --.-- |
| col. 01, line 63 | after "junction" | insert --.-- |
| col. 02, line 19 | after "device" | insert --.-- |
| col. 02, line 54 | delete "ay" | insert --may-- |
| col. 03, line 23 | after "devices" | insert --.-- |
| col. 03, line 52 | delete "an" | insert --and-- |
| col. 03, line 51 | delete "dice" | insert --diode-- |
| col. 03, line 54 | delete "o" | insert --to-- |
| col. 03, line 58 | delete "preset" | insert --present-- |
| col. 03, line 62 | after "device" | insert --.-- |
| col. 03, line 66 | delete "5" | insert --15-- |
| col. 03, line 67 | delete "0" | insert --60-- |

UNITED STATES PATENT AND TRADEMARK OFFICE
CERTIFICATE OF CORRECTION

PATENT NO. : 4,821,096

DATED : 4/11/89

INVENTOR(S) : Maloney

It is certified that error in the above-identified patent and that said Letters Patent is hereby corrected as shown below:

| | | |
|---|---|---|
| col. 04, line 11 | delete "Additional" | insert --Additionally-- |
| col. 04, line 20 | delete "i.e." | insert --is-- |
| col. 04, line 28 | delete "o" | insert --of-- |
| col. 04, line 31 | delete "sown" | insert --shown-- |
| col. 04, line 61 | delete "3]" | insert --31-- |
| col. 04, line 68 | delete "3C" | insert --30-- |
| col. 05, line 10 | delete "ba" | insert --be-- |
| col. 05, line 14 | delete "wit" | insert --with-- |
| col. 05, line 21 | after "excess" | insert --energy-- |
| col. 06, line 32 | after "second" | insert --region-- |

Signed and Sealed this

Twenty-ninth Day of January, 1991

*Attest:*

HARRY F. MANBECK, JR.

*Attesting Officer*  *Commissioner of Patents and Trademarks*